United States Patent [19]
Arnold et al.

[11] 3,973,146
[45] Aug. 3, 1976

[54] SIGNAL DETECTOR COMPRISING FIELD EFFECT TRANSISTORS

[75] Inventors: Emil Arnold, Tarrytown; Merton H. Crowell, Mahopac; Edward H. Stupp, Spring Valley, all of N.Y.

[73] Assignee: North American Philips Corporation, New York, N.Y.

[22] Filed: Sept. 17, 1975

[21] Appl. No.: 614,928

Related U.S. Application Data

[63] Continuation of Ser. No. 451,782, March 18, 1974, abandoned, which is a continuation of Ser. No. 322,633, Jan. 11, 1973, abandoned.

[52] U.S. Cl. .................................. 357/26; 357/23; 357/41; 357/45; 357/32; 310/8.1; 333/72
[51] Int. Cl.² .................. H01L 29/78; H01L 29/84; H01L 27/10; H01L 27/02
[58] Field of Search .................. 357/23, 26, 32, 41; 357/45; 333/72; 310/8.1

[56] References Cited
UNITED STATES PATENTS
3,294,988  12/1966  Packard ............................... 357/26

FOREIGN PATENTS OR APPLICATIONS
1,266,529  3/1972  United Kingdom ................... 357/26

Primary Examiner—Edward J. Wojciechowicz
Attorney, Agent, or Firm—Frank R. Trifari; Leon Nigohosian

[57] ABSTRACT

A signal detector including a transducer element, an X-Y addressed array of field-effect transistor electrically coupled, e.g., capacitively or directly coupled, to the transducer element, and means for addressing the transistor X-Y array.

12 Claims, 4 Drawing Figures

SIGNAL DETECTOR COMPRISING FIELD EFFECT TRANSISTORS

This is a continuation of application Ser. No. 451,782, filed Mar. 18, 1974, now abandoned, which in turn is a continuation of Ser. No. 322,633, filed Jan. 11, 1973, now abandoned.

BACKGROUND OF THE INVENTION

The present invention is related to a signal detector and particularly to an image sensing device for converting the thermal radiant energy of an object to electrical signals.

Prior art systems employing quantum detectors suffer from the disadvantage of requiring cooling thereof during operation whereas previous imaging systems employing single detectors and linear arrays require mechanical scanning, with its inherent limitations. One type of such mechanical scanning involves an oscillating mirror that reflects radiation to various parts of a linear array but this arrangement is not wholly satisfactory. The image sensor of the present invention exhibits significant advantages over these prior art devices; namely, operating temperatures at room temperature levels and the avoidance of any need for mechanical scanning.

SUMMARY OF THE INVENTION

Briefly described, the present invention comprises a signal detector including a transducer element, an X-Y addressed array of field-effect transistors electrically coupled, e.g., capacitively or directly coupled, to the transducer element, and means for addressing the transistor X-Y array. The signal detector can be a radiant energy image sensor, e.g., an infrared image sensor, or an acoustical sensor. The signal detector can further comprise an electrode layer on the surface of the transducer element, the electrode layer being permeable to incoming signals to the transducer, e.g., infrared radiation or acoustic signals.

DESCRIPTION OF THE PREFERRED EMBODIMENT

Figure 1:
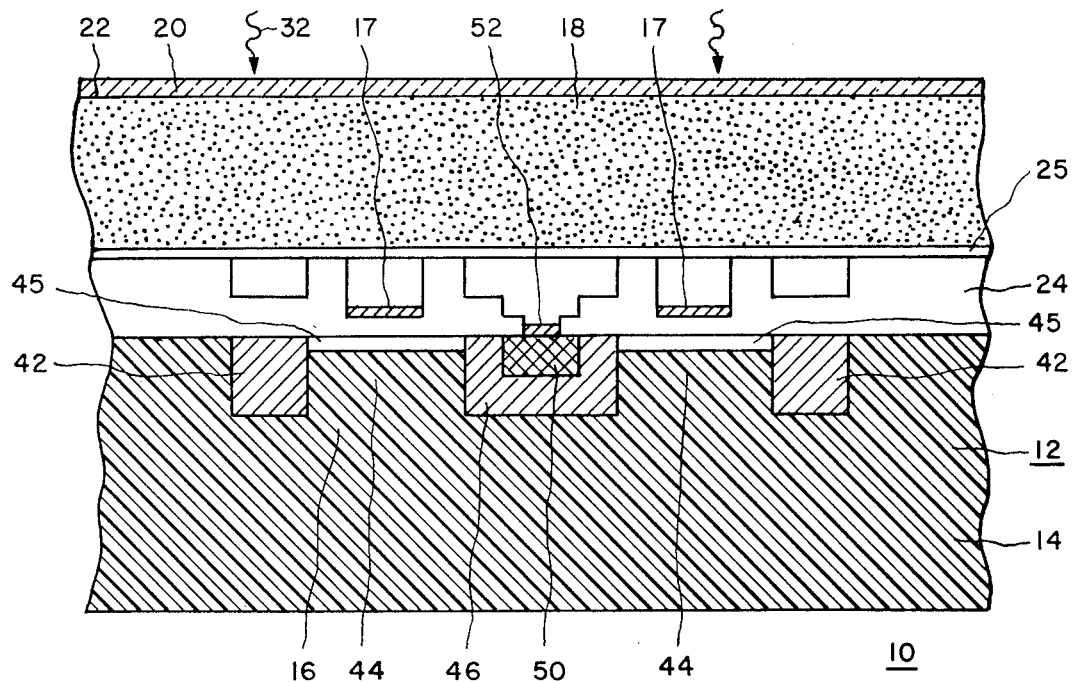
FIG. 1 is a cross-sectional elevation view of a single image sensor element of a signal detector produced according to the present invention.
Figure 3:
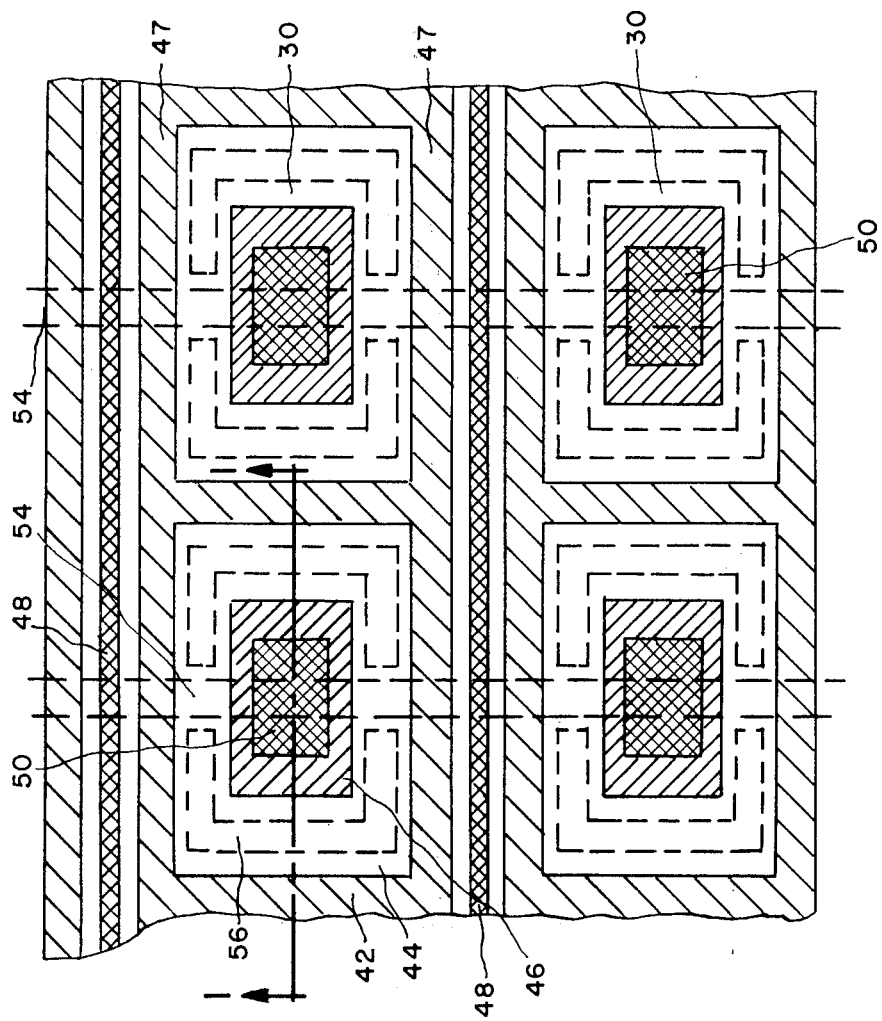
FIG. 3 is a partial top view depicting the array geometry of the signal detector of FIG. 1.

An infrared image sensing device 10 (FIG. 1) produced according to one embodiment of the present invention comprises a support structure 12 that comprises a semiconductor substrate 14 including an array of field-effect transistors 16 comprising metal gates 17; a transducer element comprising a layer 18 of pyroelectric material disposed over the support structure 12 and electrically coupled, i.e., directly or, as shown in FIG. 1, capacitively coupled, to the metal gates 17 of the transistors 16; transparent (which is defined herein to include semitransparent) electrode layer 20 disposed on the surface 22 of the pyroelectric layer 18 removed from the support structure 12, and addressing means (described below) for interrogating various ones of the transistors. Where the field-effect transistors (e.g., 16 in FIG. 1) are of the MOS variety, they include an insulating film 24 of e.g., silicon dioxide, between the channel regions and metal gates 17. However, the field-effect transistors can be of the junction type which do not require such an insulating film. A high electrical resistance film 25 may be disposed between the support structure 12 and the pyroelectric layer 18 to facilitate removal of spurious electric charges. The film 25 preferably is of material having a resistivity level below that of the layer 18, which material can be inter alia, cadmium telluride, antimony trisulfide, or silicon, the film 25 being producible by vacuum evaporation according to well known techniques. The image sensing device 10 is constructed to comprise a plurality of radiant energy image sensor elements 30 (FIG. 3) capable of sensing infrared radiation 32 (FIG. 1) from an image. The image sensor elements 30 individually comprise a part of the layer 18 of pyroelectric material, such as trigylcine sulfate (TGS), for example, and a field-effect transistor device 16 capacitively coupled to this corresponding part of the pyroelectric layer 18. The pyroelectric layer 18 can be continuous or interrupted, e.g., the pyroelectric layer 18 can be a crystal of pyroelectric material that is polished on both sides, the crystal being separately produced and then placed on the support structure in close proximity to the transistors. Alternatively, a pyroelectric thin film may be, for example, deposited or sprayed on the support structure. Adjacent to the surface 22 of the pyroelectric layer 18 remote from the support structure 12 there may be a radiant energy-absorbing layer (not shown), of, e.g., gold black, to enhance the absorption of radiant energy near the surface. Where a transparent electrode layer, e.g., 20 in FIG. 1, is present, the radiant energy-absorbing layer advantageously is disposed between the electrode layer and the pyroelectric layer. The field-effect transistors can be insulated gate or junction gate, there being shown in FIGS. 1 and 3 metal oxide-semiconductor (MOS) type field-effect transistors that individually include a diffused source region 42, a channel region 44 and a drain region 26. Where the semiconductor substrate 14 is of p type conductivity and a portion thereof forms the channel region 44, as shown in FIG. 1, the diffused source and drain regions, 42 and 46, respectively, are of an opposite conductivity type, i.e., n type. In the image sensing device 10, there result channels 45 comprising n-type conductivity inversion layers formed at the channel regions 44 and adjoining the substrate surface. The semiconductor substrate material can be p or p+ type silicon, for example. The source regions 42 of the respective field-effect transistors forming a line, i.e., row or a column, as the case may be, are electrically connected to strip regions 47, (FIG. 3) of the same conductivity type but highly doped e.g., n+ type conductivity, the strip regions 47 being producible by doping the semiconductor substrate to produce diffused strips of the desired conductivity type. The strip regions 47 serve as electrical conductors to the various transistors of the same row or column, thereby serving as an addressing path for the interrogation of the transistors to whose source regions they are connected. In FIG. 3, the strip regions 47 are used as row, i.e., X-direction, access lines. The n+ strip regions 47 of each line of infrared image sensing elements are isolated from other such strips regions by p-type diffused lines 48.

Within the various drain regions 46 there are located diffused islands 50 of conductivity type opposite that of the drain regions 46, so that the drain regions 46 and their respective islands 50 form p, n junctions. In the structure shown in FIG. 1, with n type drain regions 46, the diffused islands 50 are of p type conductivity, the p, n junctions thus provided being used as diode switches (46, 50 in FIG. 2) in the address of the various transistors. The layer 24 of the electrically insulating material can be of e.g., silicon dioxide, located over the semiconductor substrate 14. At various apertures in the insulating layer 24 that are in registry with the diffused islands 50, there are metal contact regions 52 of, for example, aluminum, which contact regions 52 serve to connect electrically the drain regions 46 to various conducting strips 54 (FIG. 3) of, e.g., aluminum, which serve in addressing the various transistors. In the equivalent circuit diagrams of FIGS. 2 and 4, the conducting strips 54 form column, or Y-direction, access lines.

The metal (e.g., aluminum) gates 17 at areas of the insulating layer 24 that are located above the channel regions 44, are capacitively connected to the pyroelectric layer. The electrode layer 20 of semi-transparent or transparent electrically conducting material, at the surface 22 of the pyroelectric layer 18, provides electrical contact to the pyroelectric layer 18. Where the transducer element, e.g., the pyroelectric layer 18, is to be directly connected electrically to the metal gates of the substrate field-effect transistors, the metal providing the gate may be deposited to a thickness sufficient to permit contact with the transducer element when the latter is placed on the support structure. In the case of a support structure such as that shown in FIG. 1, the metal gate that would occupy the position of and correspond to the metal gate 17, would extend above the insulating layer 24 so as to contact the pyroelectric layer or, if one were present, the high electrical resistance film (e.g., 25 in FIG. 1) disposed on the pyroelectric layer for removing spurious electric charges. Some other pyroelectric materials that can be used are, e.g., thallium arsenic selenide, lead zirconate titanate, and lead lanthanum zirconate titanate.

Figure 2:
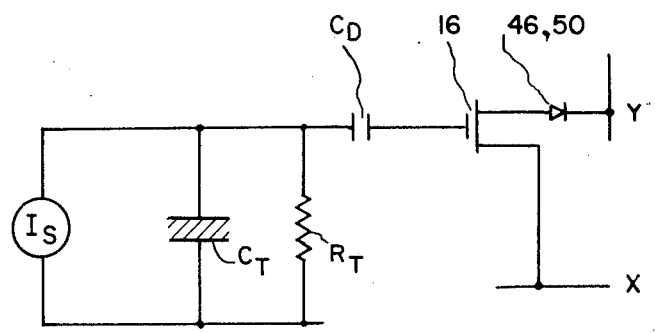
FIG. 2 is an equivalent circuit diagram of a single sensor element of the type shown in FIG. 1, the transducer element being capacitively coupled to the field effect transistors.

In the operation of the infrared image sensing device 10, output signals are produced by the infrared radiation incident thereon, the intensity of such radiation being a function of the viewed image's temperature. During such operation, a thermal image of the viewed object is obtained by means of, for example, an optical system comprising an infrared lens (not shown), the thermal image being a function of the thermal radiation 32 (FIG. 1) emitted by the object. The thermal image is projected onto the pyroelectric layer 18 through the transparent electrode 20, which is maintained at ground potential. The sensing device 10 is employed with apparatus providing a reference level to which the intensity of the radiation incident upon each sensor element of the sensing device 10, can be compared. One such means for making such a comparison is, for example, a mechanical chopper or shutter that regulates the exposure of the image sensor elements to the infrared radiation, as described below. The pyroelectric layer 18 acts as a transducer by converting the incident thermal image into a pattern of electrical charges. The electric charges of the pattern are distributed over the pyroelectric layer surface in direct correspondence to the infrared radiation distribution of the thermal image. The signal generated at one sensor element by the infrared radiation during a scanning frame is represented in FIG. 2 by $I_S$, where $C_T$ is the capacitance of the transducer element, i.e., the pyroelectric layer at the regions of the gate electrodes 56, $R_T$ is the corresponding shunt resistance of the transducer element at these regions, $C_D$ is the capacitance of the dielectric gap at these regions (i.e., the capacitance of the air gaps as shown in FIG. 1, or of a dielectric material, not shown, that can be disposed between the high electrical resistance film 25 of the transducer element, and the field-effect transistor 16), and the field-effect transistor and the diode are indicated by numbers 16 and 46,50, respectively.

The signal $I_S$ at the transducer element result in surface electrical charges generating a potential difference across the pyroelectric layer 18, the pattern of potential differences throughout the layer corresponding to the electrical charge pattern and, therefore, to the thermal image's infrared radiation distribution. The pattern of potential differences is detected by the transistor array of the support structure 12, this being done by the effect of the pyroelectric layer potential difference on the transistor channel regions 44 via the metal gate electrodes 17, and the consequent regulation, at the channel regions, of the charge carriers flowing from the source 42 to the drain 46 via the channel regions 44.

Figure 4:
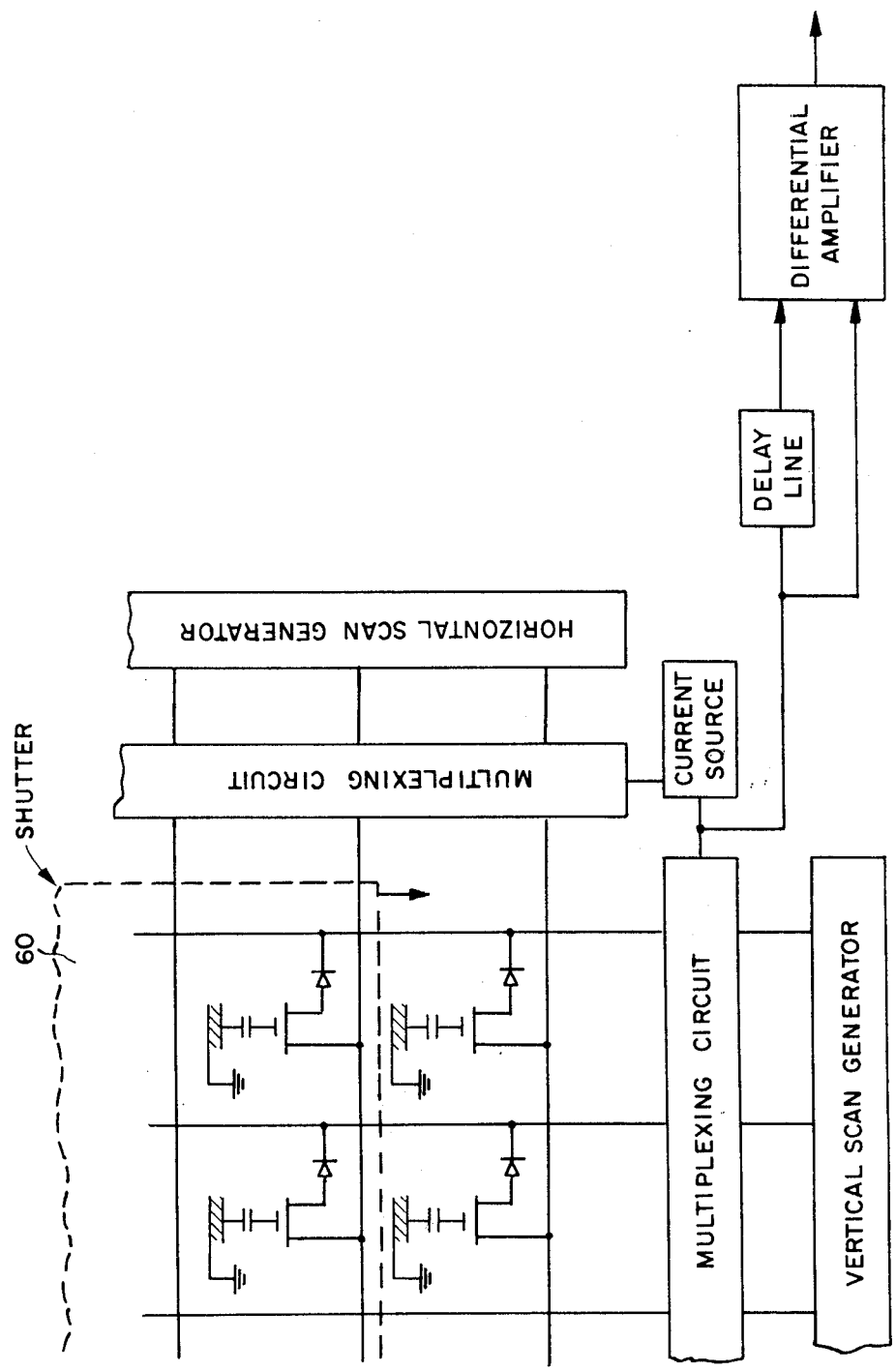
FIG. 4 is an equivalent circuit diagram of the portion of the signal detector shown in FIG. 3 together with the X-Y addressing system.

During the operation of the infrared sensing device in one embodiment of the present invention, the amount of radiant energy impinging upon the pyroelectric layer of the image detector is regulated, as by chooper or shutter 60 (FIG. 4), for example, the shutter traveling at the same rate as the horizontal line scan (FIG. 4). The shutter moves over the pyroelectric layer so that the lines (i.e., a row where the shutter moves in the Y-direction, as shown in FIG. 4) of sensor elements are individually interrogated just before each line is covered by the shutter and interrogated again just before the parts of the pyroelectric layer included in these sensor elements are exposed to the scene as the shutter opens. In this way, each line of infrared sensor elements is allowed to view (i.e., the transistors of the various sensor elements sense the potential difference in corresponding part of the pyroelectric layer, arising from the charge pattern produced by the thermal image), alternatively, the temperature of the scene (i.e., the infrared radiation from the image) and the temperature of the shutter for a frame period, the shutter temperature serving, in this instance, as a reference level to which the incident radiation is compared. The beginning of the video frame advantageously is synchronized with the edge of the shutter. When the shutter edge passes over a line of infrared sensor elements, the temperature of each such infrared sensor element begins to change and the output signal thereof after a single frame time is proportional to the change in radiant energy incident thereon during the frame time, where the frame time, $T_F$ preferably is related to shutter period (i.e., open plus closed of the shutter) in accordance with the expression $$T_f = T_s/2n,$$

$T_s$ being the shutter period and $n$ being a positive integer.

To compare the signals resulting from the exposure to the scene and from the exposure to the shutter, the output signal is, for example, divided and passed through a delay line such as a bucket brigade or a shift register. If the length of the delay is exactly one frame time, the difference between the delayed and undelayed signals corresponds to the difference between the outputs or a given element with the shutter closed and open. The subtraction is accomplished by means of a differential amplifier where output gives the desired video signal. Aside from this technique, other information processing techniques can be used.

The infrared imaging system described above is capable of good differential temperature sensitivity and provides great sensitivity by virtue of its operation in the charge storage mode, these advantages being further to those mentioned above, viz., no need for mechanical scanning and no requirement for cooling the infrared sensor device.

The signal detector of the present invention can be one detecting signals other than infrared signals, such as an acoustical sensor that has a construction similar to the infrared image sensor shown in FIG. 1, except that the pyroelectric layer is replaced by a layer of suitable piezoelectric material, such as barium titanate or barium strontium niobate or even materials exhibiting both pyroelectric and piezoelectric properties, e.g., triglycine sulfate. The piezoelectric crystal is electrically, e.g., capacitively or directly, coupled with the field-effect transistors and is capable of producing an electric charge pattern in response to the acoustic signal impinging thereon. The mode of operation of such an acoustical signal detector is similar to that of the pyroelectric sensor described above.

We claim:
1. A signal detector for detecting a signal comprising:
   a. a support structure comprising a semiconductor substrate containing an array of field-effect transistors individually comprising a channel region and a gate electrode disposed at said channel region;
   b. a transducer element disposed on said support structure and electrically coupled with said gate electrodes of said transistor array, said transducer element consisting of a material selected from the group consisting of a pyroelectric material and a piezoelectric material so as to produce an electric charge pattern in response to said signal;
   c. an electrode layer disposed on said transducer element at the side removed from said support structure, said electrode layer being permeable to said signal and electrically grounded; and
   d. means for electrically addressing said transistor array.

2. A signal detector as defined in claim 1, wherein said pyroelectric material is selected from the group consisting essentially of triglycine sulfate, thallium arsenic selenide, lead zirconate titanate, and lead lanthanum zirconate titanate.

3. A signal detector as defined in claim 1, wherein the exposed surface of said electrode layer is blackened, thereby enhancing the absorption of said radiation by said signal.

4. A signal detector as defined in claim 1, wherein a high electrical resistance film is interposed between said transducer element and said semiconductor substrate, thereby facilitating the removal of spurious electric charges.

5. A signal detector device as defined in claim 1, wherein said field-effect transistors individually comprise source, channel and drain regions and said signal detector comprises an array of signal sensor elements individually comprising one of said transistors and a corresponding part of said transducer element capacitively coupled to said one transistor, said sensor elements being arranged in lines respectively extending in a first and a second direction, said source regions of ones of said transistors comprising one of said lines extending in said first direction being electrically interconnected and said drain regions of others of said transistors comprising a line extending in said second direction being electrically interconnected.

6. A signal detector as defined in claim 5, wherein said semiconductor substrate further comprises diffused strip regions interconnecting respective ones of said source regions, said strip regions being highly doped to the same conductivity type as said source regions and ones of said strip regions associated with a said line of sensor elements being isolated from others of said strip regions by highly doped regions of opposite conductivity type.

7. A semiconductor device as defined in claim 1, wherein said field-effect transistors comprise drain regions and said semiconductor substrate further comprises diffused islands having a conductivity type opposite that of said drain regions and located within said drain regions, said drain regions and diffused islands forming respective p,n junctions, whereby said p,n junction serve as diode switches in addressing said transistors.

8. A signal detector as defined in claim 1, wherein said transistor array comprises field-effect transistors individually comprising source, channel, and drain regions and a gate electrode disposed over said channel region, said gate electrodes extending substantially to said transducer element, whereby said transistors individually are in direct electrical connection with said transducer element.

9. A signal detector as defined in claim 1, wherein said transistor array comprises field-effect transistors individually comprising source, channel, and drain regions, a gate electrode disposed over said channel regions, and a film of electrically insulating material interposed between said channel region and said gate electrode.

10. A signal detector as defined in claim 9, wherein said field-effect transistors individually comprise source, channel, and drain regions and a gate electrode disposed over said channel region, said gate electrode being spaced from said transducer element, whereby said transistors are capacitively coupled to said transducer element.

11. A signal detector as defined in claim 1, further comprising means for providing a reference level to which said signal incident upon a sensor element of said signal detector can be compared.

12. A signal detector as defined in claim 11, wherein said transistor array comprises field-effect transistors disposed in rows and columns and said means comprises a shutter adapted to move in sequence over one of the directions of said rows and columns.

* * * * *